United States Patent [19]
Deguchi et al.

[11] Patent Number: 5,665,166
[45] Date of Patent: Sep. 9, 1997

[54] PLASMA PROCESSING APPARATUS

[75] Inventors: Youichi Deguchi, Tokyo; Satoru Kawakami, Sagamihara; Yoichi Ueda, Yokohama; Mitsuaki Komino, Tokyo, all of Japan

[73] Assignee: Tokyo Electron Limited, Tokyo, Japan

[21] Appl. No.: 735,489

[22] Filed: Oct. 23, 1996

Related U.S. Application Data

[63] Continuation of Ser. No. 187,863, Jan. 28, 1994, abandoned.

[30] Foreign Application Priority Data

| Jan. 29, 1993 | [JP] | Japan | 5-034249 |
| Jan. 29, 1993 | [JP] | Japan | 5-034255 |
| Feb. 15, 1993 | [JP] | Japan | 5-048541 |
| Feb. 16, 1993 | [JP] | Japan | 5-049996 |

[51] Int. Cl.$^6$ ............................. C23C 16/00
[52] U.S. Cl. ............ 118/723 E; 118/724; 118/725; 118/728
[58] Field of Search ............ 118/723 E, 724, 118/725, 728, 663; 156/345, 643.1, 626.1, 627.1; 204/298.03, 298.09, 298.32

[56] References Cited

U.S. PATENT DOCUMENTS

| 4,933,063 | 6/1990 | Katsura | 204/298.03 |
| 5,203,945 | 4/1993 | Hasegawa | 156/345 |
| 5,213,658 | 5/1993 | Ishida | 156/643 |
| 5,273,610 | 12/1993 | Thomas | 156/345 |
| 5,340,460 | 8/1994 | Kobayashi | 204/298.09 |
| 5,382,311 | 1/1995 | Ishikawa | 156/345 |
| 5,433,813 | 7/1995 | Kuwabara | 156/345 |

*Primary Examiner*—John Niebling
*Assistant Examiner*—Joni Y. Chang
*Attorney, Agent, or Firm*—Oblon, Spivak, McClelland, Maier & Neustadt, P.C.

[57] ABSTRACT

Disclosed is a plasma processing apparatus, comprising a first electrode on which an object to be processed is to be disposed, a second electrode arranged to face the first electrode, a high frequency power supply for supplying a high frequency power between the first and second electrodes, a processing gas supplying mechanism for forming a plasma into a region between the first and second electrodes, and a bias potential detecting mechanism for detecting the bias potential of the first electrode. The bias detecting mechanism has a detecting terminal positioned in the vicinity of the object to be processed.

36 Claims, 11 Drawing Sheets

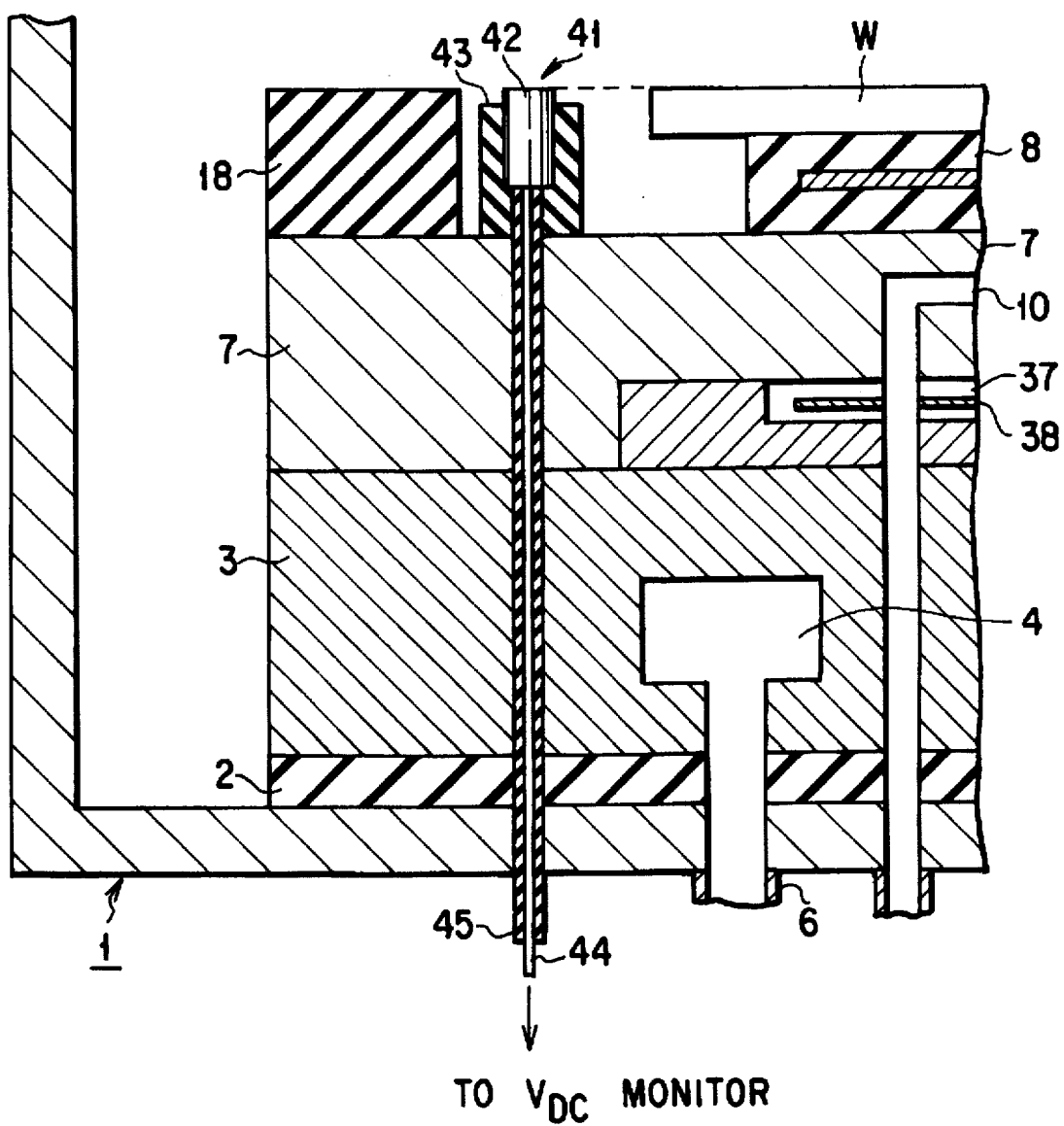
F I G. 3

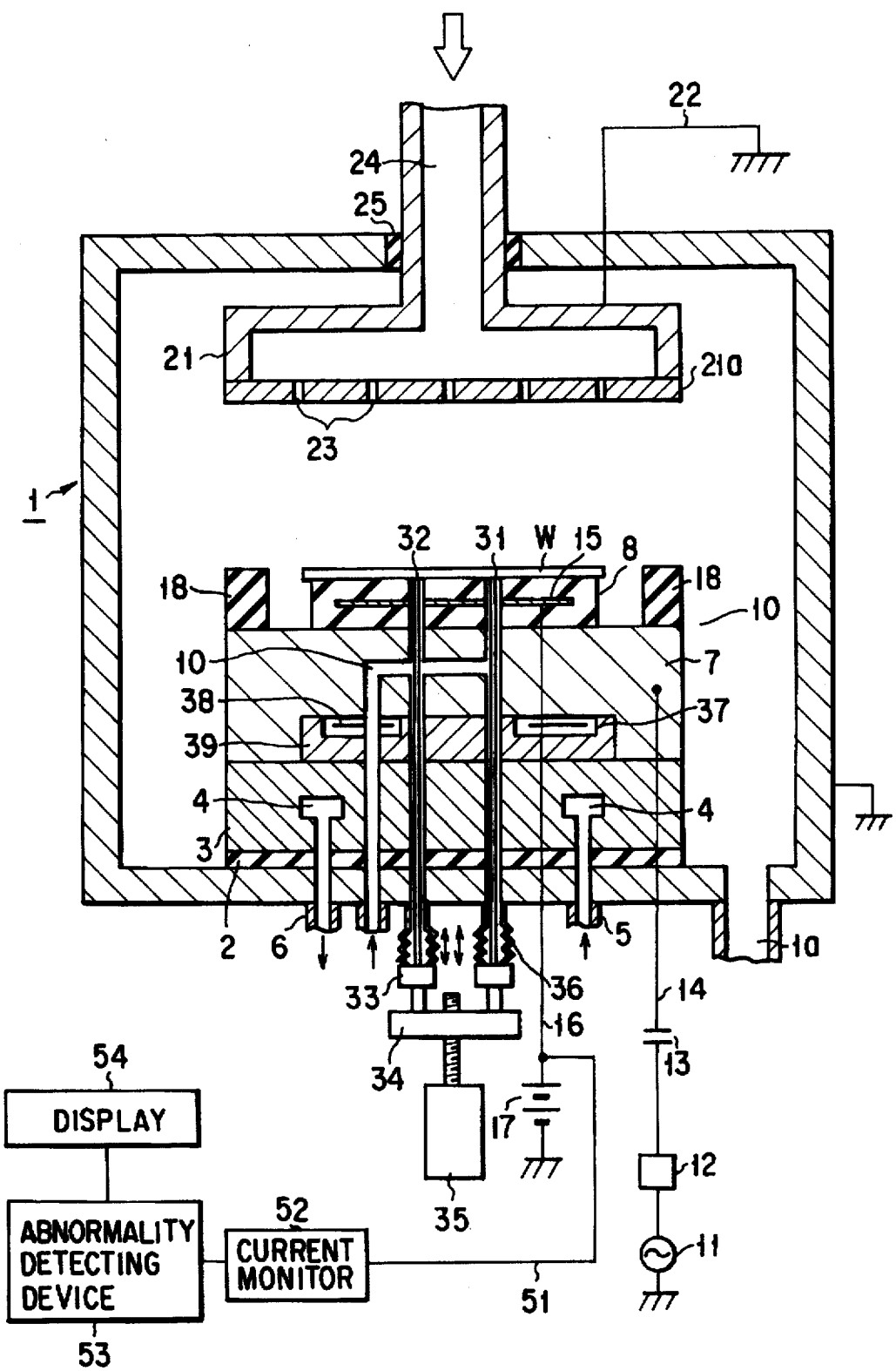
F I G. 6

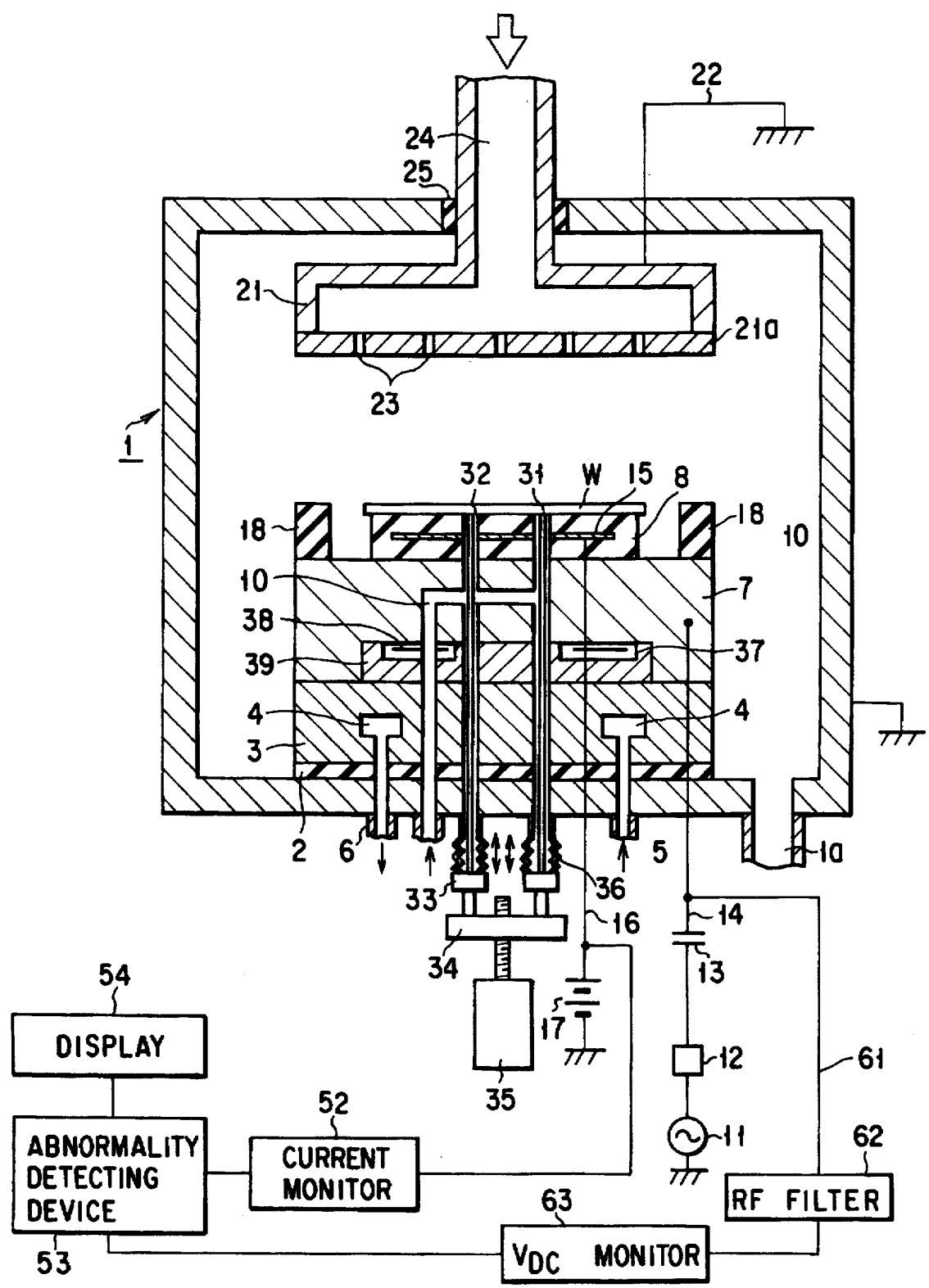
F I G. 7

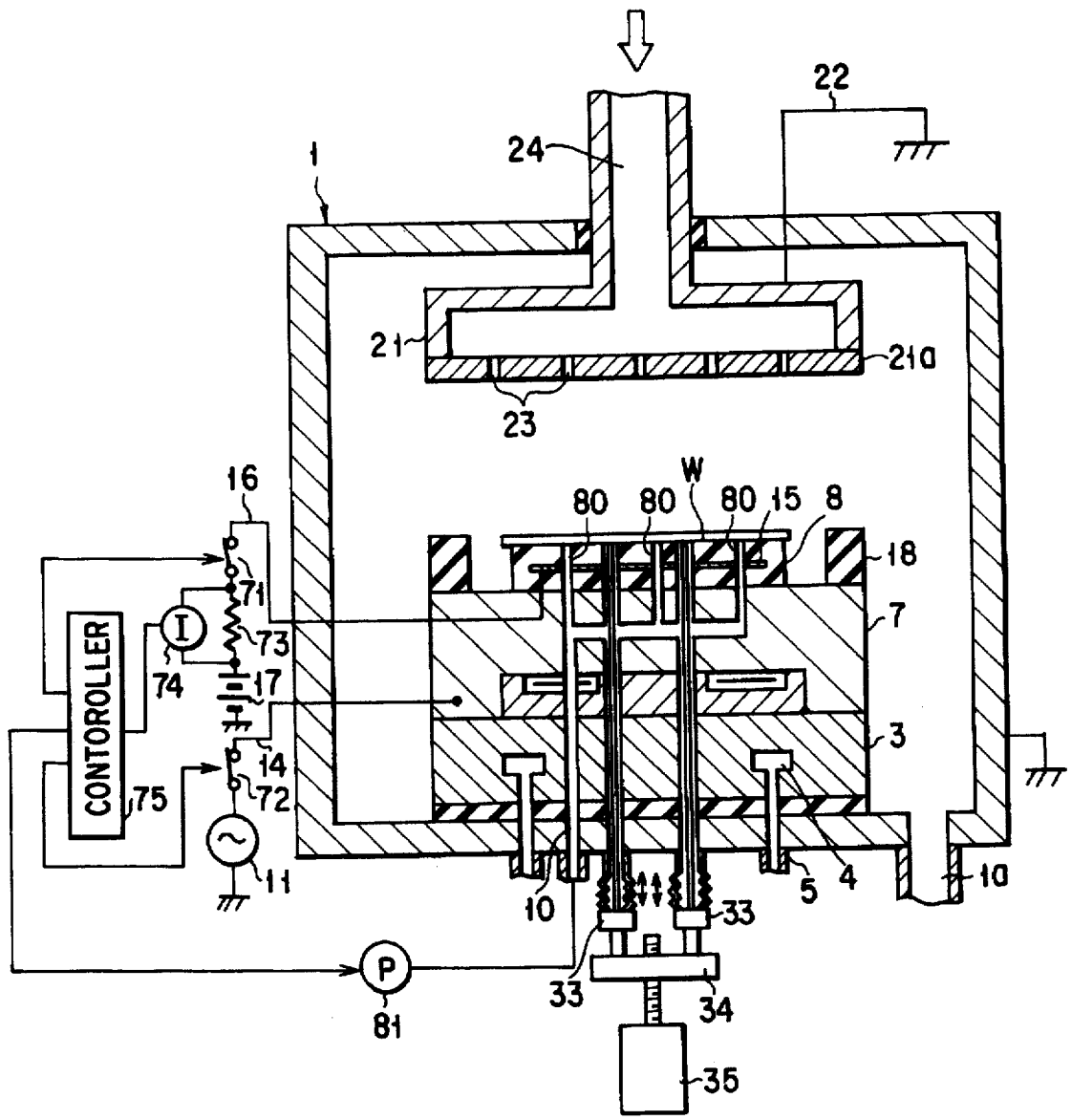
F I G. 9

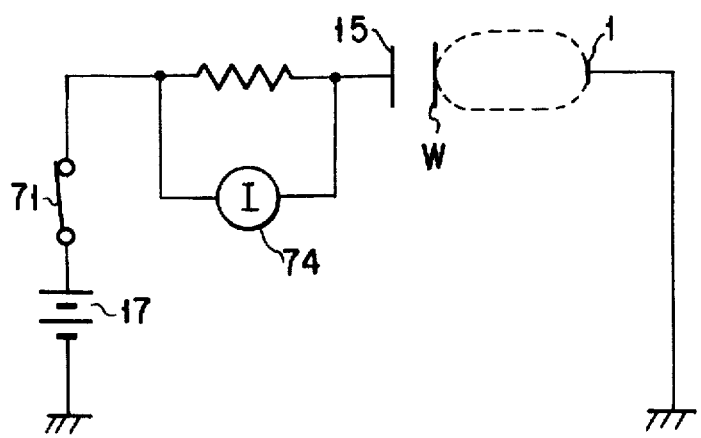
F I G. 10
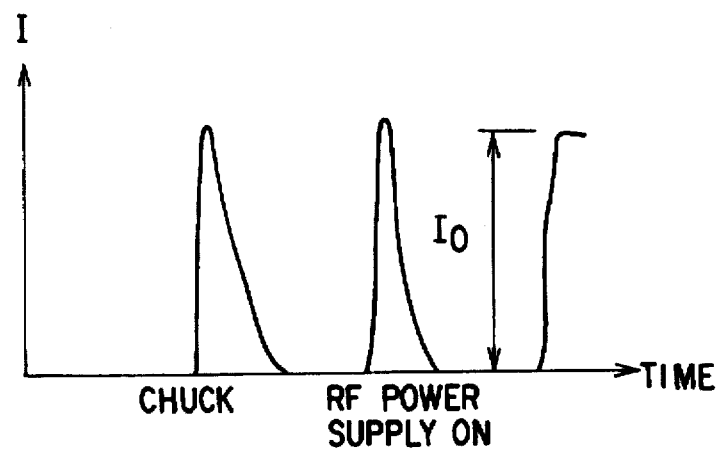
F I G. 11A
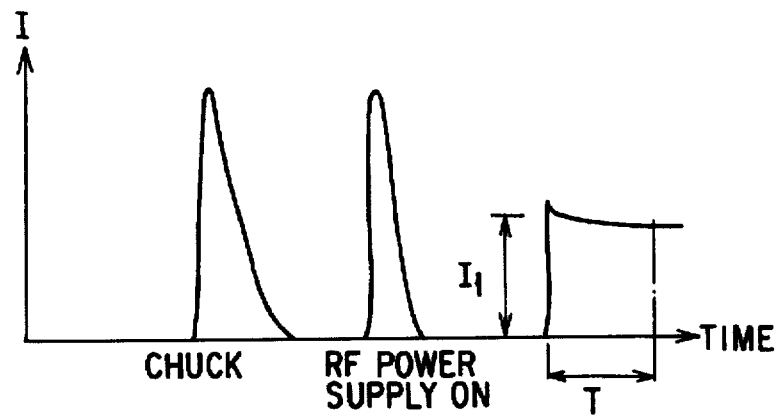
F I G. 11B

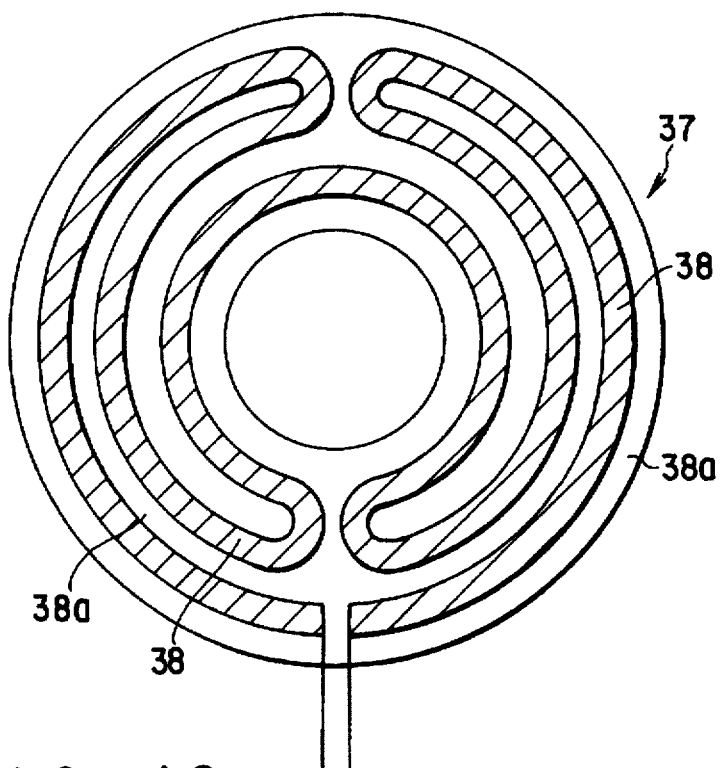
F I G. 12
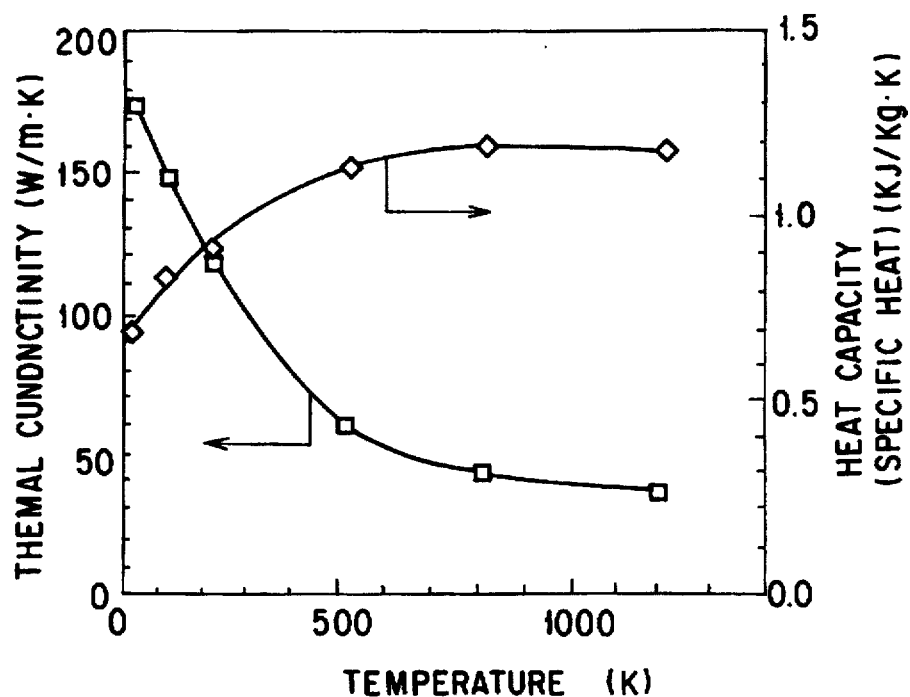
F I G. 13

PLASMA PROCESSING APPARATUS

This application is a Continuation of application Ser. No. 08/187,863, filed on Jan. 28, 1994, now abandoned.

BACKGROUND OF THE INVENTION

1. Field of the Invention

The present invention relates to a plasma processing apparatus.

2. Description of the Related Art

In applying, for example, an etching process to a semiconductor wafer by generating a plasma, a sheath voltage $V_s$, which is greatly dependent on the energy of the ion and is an important parameter of the etching, is determined by a plasma potential $V_p$ and a negative potential $V_{DC}$ with which a negative electrode is biased. Since the negative potential $V_{DC}$ is more dominant than the plasma potential $V_p$, it is important to measure particularly the negative voltage $V_{DC}$.

Let us describe how the negative voltage $V_{DC}$ is measured in the conventional technique with reference to FIG. 1 showing a general RIE type plasma etching apparatus 101. As shown in the drawing, an upper electrode 103 and a lower electrode 104 are arranged to face each other within a processing chamber 102. A semiconductor wafer 108 is electrostatically chucked by an electrostatic chuck 107 mounted on the upper surface of the lower electrode 104. Under this condition, a plasma-forming gas is introduced into the processing chamber 102 through a gas passageway 114 and a plurality of gas spurting ports 115 formed in the upper electrode 103. At the same time, a high frequency power is supplied from a high frequency power supply 105 to the lower electrode 104 through a matching circuit 113 and a blocking capacitor 106 so as to generate a plasma in the space between the upper electrode 103 and the lower electrode 104, with the result that a plasma etching is applied to the semiconductor wafer 108.

For monitoring the negative potential $V_{DC}$ in the plasma etching apparatus 101 of the construction described above, an appropriate lead wire 110 is connected to a power supply wire 109 extending between the lower electrode 104 and the blocking capacitor 106. As shown in FIG. 1, the lead wire 110 is connected to the power supply wire 109 outside of the processing chamber 102. Further, a $V_{DC}$ monitor 112 is connected to the lead wire 110 with an RF filter 111 interposed therebetween so as to permit the monitor 112 to monitor the negative potential $V_{DC}$.

It should be noted, however, that an anodic oxidation treatment is applied to the surface of the lower electrode 104, with the result that an anodic oxide film 104a is formed on the surface of the lower electrode 104. Further, the electrostatic chuck 107 is formed of an insulating material. It follows that it is impossible to monitor accurately the negative potential $V_{DC}$ even if the lead wire 110 is directly connected to the lower electrode 104.

In the conventional apparatus, however, it is unavoidable to connect the $V_{DC}$ monitor 112 to the power supply wire 109 via the RF filter 111, as described previously, though it is impossible in this case to monitor accurately the negative potential $V_{DC}$. The value obtained by the $V_{DC}$ monitor 112 thus connected is used as the negative potential $V_{DC}$ on the semiconductor wafer 108. In this case, however, the expected result of the plasma processing cannot be obtained in some cases even if the frequency and output of the high frequency power supply 105 are controlled on the basis of the $V_{DC}$ level monitored by the $V_{DC}$ monitor 112 because an accurate $V_{DC}$ level cannot be obtained in the prior art as pointed out above.

On the other hand, where a plasma processing such as an etching is applied to a semiconductor wafer, occurrence of an abnormal discharge within the processing chamber tends to do damage to not only the semiconductor wafer but also the various devices and parts within the processing chamber. In such a case, it is necessary to locate the position where the abnormal discharge has taken place so as to take countermeasures promptly such as replacement or repair of the damaged parts of the processing chamber.

In the conventional technique, the abnormal discharge occurring within the processing chamber is detected by measuring the negative potential $V_{DC}$ as described above. To be more specific, the abnormal discharge is detected by observing the negative potential $V_{DC}$ monitored by the $V_{DC}$ monitor 112 shown in FIG. 1.

Where the negative potential $V_{DC}$ with which the lower electrode 104 is biased is measured by the conventional method described above, it is certainly possible to detect with some accuracy the abnormal discharge within the processing chamber 102 on the basis of the fluctuation in the detected $V_{DC}$ level. However, the $V_{DC}$ value monitored by the $V_{DC}$ monitor 112 is not necessarily accurate as described previously. In addition, it is not reasonable to determine that the fluctuation in the detected $V_{DC}$ value has been caused without fail by the abnormal discharge occurring within the processing chamber 102. For example, it is possible for an abnormality occurring in the power supply system of the high frequency power supply 105 to have caused the fluctuation in the detected $V_{DC}$ value. What should also be noted is that, even if occurrence of an abnormal discharge has been detected, it is impossible to detect the specific position within the processing chamber 102 where the abnormal discharge has taken place.

Further, in the case of mounting a semiconductor wafer as an object to be processed on the surface of an electrostatic chuck, the wafer is deviated from a desired location on the surface of the electrostatic chuck in some cases. If a plasma processing is applied to the wafer deviant from the desired location, it is impossible to apply the plasma processing uniformly to the wafer. In addition, the electrostatic chuck is exposed to the plasma, leading to insulation breakdown of the electrostatic chuck. Further, the wafer is likely to be blown away by the back pressure of a helium gas supplied through the electrostatic chuck toward the wafer for the heat transfer. The wafer thus blown away by the back pressure of the helium gas tends to be broken.

SUMMARY OF THE INVENTION

The present invention has been achieved in view of the situation described above, and its object is to provide a plasma processing apparatus, which permits measuring the negative potential $V_{DC}$ (bias potential) accurately.

Another object of the present invention is to provide a plasma processing apparatus, which permits detecting with a high accuracy the abnormal discharge in the plasma processing step.

Still another object is to provide a plasma processing apparatus, which permits detecting not only the abnormal discharge occurring in the plasma processing step but also the position where the abnormal discharge has occurred.

A further object of the present invention is to provide a plasma processing apparatus which permits detecting the deviation of an object to be processed from a desired location on the surface of the electrostatic chuck.

According to a first aspect of the present invention, there is provided a plasma processing apparatus, comprising:

a first electrode on which an object to be processed is to be disposed;

a second electrode arranged to face the first electrode;

a high frequency power supply for supplying a high frequency power between the first and second electrodes;

means for supplying a processing gas for forming a plasma into a region between the first and second electrodes; and bias potential detecting means for detecting the bias potential of the first electrode, the bias detecting means having a detecting terminal positioned in the vicinity of the object to be treated.

According to a second aspect of the present invention, there is provided a plasma processing apparatus, comprising:

a first electrode on which an object to be processed is to be disposed;

a second electrode arranged to face the first electrode;

a high frequency power supply for supplying a high frequency power between the first and second electrodes;

electrostatic chucking means mounted on the first electrode for electrostatically chucking the object;

a DC power supply for applying a voltage to the electrostatic chucking means; and current detecting means for detecting the current flowing between the electrostatic chucking means and the DC power supply.

According to a third aspect of the present invention, there is provided a plasma processing apparatus, comprising:

a first electrode on which an object to be processed is to be disposed;

a second electrode arranged to face the first electrode;

a high frequency power supply for supplying a high frequency power between the first and second electrodes;

means for supplying a processing gas for forming a plasma into a region between the first and second electrodes;

bias potential detecting means for detecting the bias potential of the first electrode;

electrostatic chucking means mounted on the first electrode for electrostatically sucking the object to be treated;

a DC power supply for applying a voltage to the electrostatic chucking means; and current detecting means for detecting the current flowing between the electrostatic suction means and the DC power source.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a cross sectional view showing in a magnified fashion a part of the apparatus shown in FIG. 2;

FIG. 6 is a cross sectional view showing a plasma processing apparatus according to a second embodiment of the present invention;

FIG. 7 is a cross sectional view showing a plasma processing apparatus according to a third embodiment of the present invention;

FIG. 9 is a cross sectional view showing a plasma processing apparatus according to a fourth embodiment of the present invention;

FIG. 10 is a circuit diagram for explaining the principle of detecting the deviation of an object to be treated from a desired location on the surface of an electrostatic chuck, said detection being carried out by the apparatus shown in FIG. 9;

FIGS. 11A and 11B are graphs each showing the current value measured by an ammeter when the location of an object to be processed is deviated from a desired location in the apparatus shown in FIG. 9;

FIG. 12 is a cross sectional view showing the heater used in the plasma processing apparatus according to each of the embodiments noted above;

FIG. 13 is a graph showing the characteristics of aluminum nitride used as a heat insulator in the heater shown in FIG. 12.

DETAILED DESCRIPTION OF THE PREFERRED EMBODIMENTS

Let us describe some preferred embodiments of the present invention with reference to the accompanying drawings.

Figure 1:
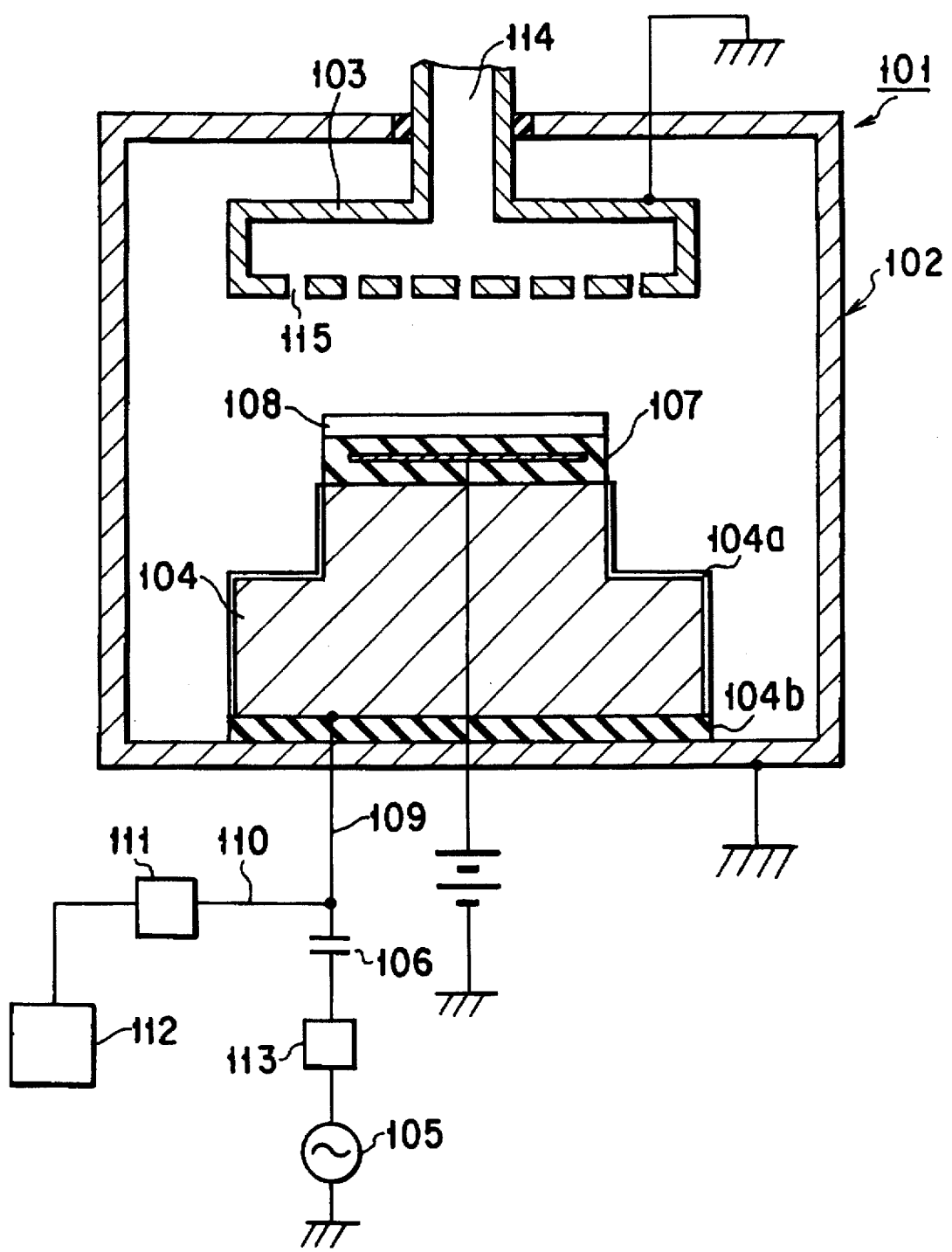
FIG. 1 is a cross sectional view showing a conventional plasma processing apparatus.
Figure 2:
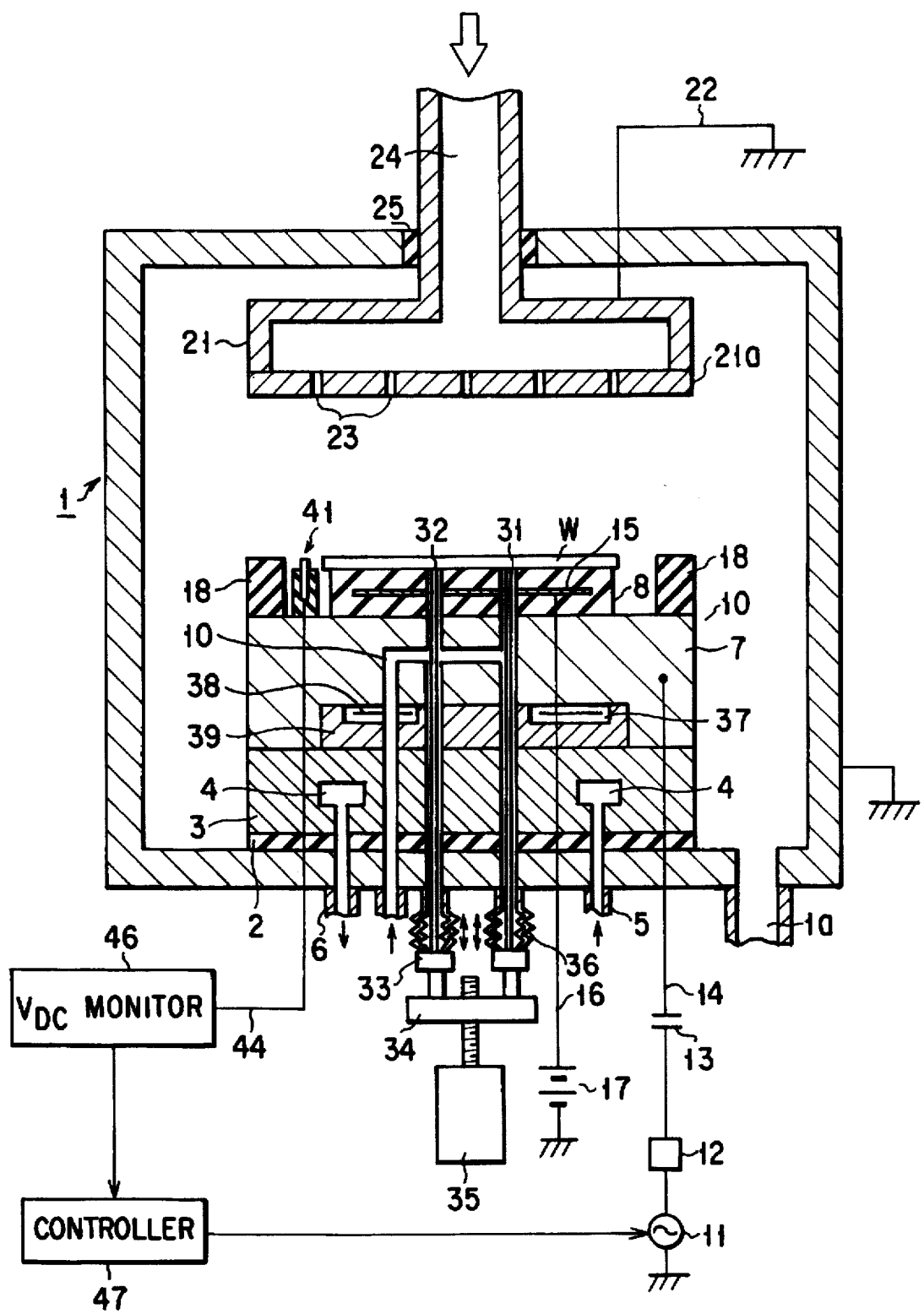
FIG. 2 is a cross sectional view showing a plasma processing apparatus according to a first embodiment of the present invention.

Specifically, FIG. 2 is a cross sectional view showing a plasma etching apparatus according to a first embodiment of the present invention. As shown in FIG. 2, the apparatus comprises a processing chamber 1 of a hermetic container made of, for example, aluminum and electrically connected to the ground. A susceptor supporting member 3 is mounted in the bottom portion of the processing chamber 1 with an insulating plate 2 made of, for example, a ceramic material interposed therebetween. A cooling chamber 4 such as a cooling jacket is formed inside the susceptor supporting member 3. A coolant inlet pipe 5 and a coolant discharge pipe 6 are connected to the bottom portion of the cooling chamber 4 for circulation of a coolant within the cooling chamber 4.

A disk-like susceptor 7 acting as a lower electrode is detachably mounted to the upper surface of the susceptor supporting member 3. The susceptor 7 is made of, for example, aluminum and includes a projection in the central portion. Further, sn electrostatic chuck 8 for directly supporting a semiconductor wafer W which is to be processed is mounted on the upper surface of the susceptor 7.

A gas passageway 10 communicating with a gas inlet pipe 9 is formed inside the susceptor 7. When a gas such as a helium gas is supplied through the gas inlet pipe 9 into the gas passageway 10 by a gas supply apparatus (not shown), the helium gas is cooled by the susceptor supporting member 3, which is cooled to a predetermined temperature by the coolant noted above. The helium gas thus cooled permits cooling the semiconductor wafer W mounted on the electrostatic chuck 8 to a predetermined temperature.

A high frequency power of, for example, 13.56 MHz is supplied from a high frequency power supply 11 disposed outside the processing chamber 1 to the susceptor 7 through a power supply wire 14. As shown in FIG. 2, the high frequency power is supplied from the high frequency power supply 11 to the susceptor 7 via a matching circuit 12 and a blocking capacitor 13.

The electrostatic chuck 8 comprises an electrically conductive layer 15 formed of, for example, an electrolytic copper foil and an insulator such as polyimide films having the conductive layer 15 sandwiched therebetween. When a DC voltage is supplied from a DC power supply 17 disposed outside the processing chamber 1 to the conductive layer 15 via a power supply lead wire 16, the semiconductor wafer W is chucked by the coulomb force to the electrostatic chuck 8.

Holes 31 are formed to extend through the bottom portion of the processing chamber 1, the insulating plate 2, the susceptor supporting member 3, the susceptor 7 and the electrostatic chuck 21. Three holes are actually formed, though only two holes 31 are shown in the drawing. A pusher pin 32 for transferring the semiconductor wafer W is movably inserted into each of these holes 31. Of course, the pusher pin 32 is movable in the vertical direction within the hole 31.

The lower ends of these pusher pins 32 are fixed to supporting members 33 of a plate 34 movable in the vertical direction and positioned outside the processing chamber 1. The supporting members 33 are also positioned outside the processing chamber 1. The plate 34 is moved up and down by a driving mechanism 35 such as a pulse motor. If the plate 34 is moved up or down by the driving mechanism 35, the pusher pins 32 are also moved up or down, with the result that the upper end surfaces of these pusher pins 32 are projected upward from the upper surface, on which the semiconductor wafer W is disposed, of the electrostatic chuck 8 or retracted into the chuck 8. These projection and retraction of the pusher pins 32 are utilized for transferring the semiconductor wafer W. To be more specific, where the wafer W is disposed on the electrostatic chuck 8, the wafer W held by a transfer arm (not shown) is disposed on the upper end surfaces of the pusher pins 32. Under this condition, the pusher pins 32 are retracted into the electrostatic chuck 8 so as to permit the wafer W to be disposed on the upper surface of the electrostatic chuck 8. Where the wafer W after the desired treatment is moved away from the electrostatic chuck 8, the pusher pins 32 are moved upward so as to upheave the wafer W. Under this condition, the transfer arm is positioned below the wafer W so as to permit the wafer W to be disposed on the transfer arm.

Bellows 36 are arranged between the supporting members 33 of the movable plate 34 and the bottom wall of the processing chamber 1. The hole 31 through which extends the pusher pin 32 is sealed from the outer atmosphere by the bellows 36.

The apparatus also comprises a gas inlet pipe 10 extending from outside the processing chamber 1 into the susceptor supporting member 3 and into the susceptor 7. The hole 31 noted above communicates with the gas inlet pipe 10. If a gas such as a helium gas is supplied into the gas inlet pipe 10, the helium gas is cooled by the susceptor supporting member 3 which is cooled in advance to a predetermined temperature by the coolant referred to previously. It follows that each of the holes 31 through which extend the pusher pins 32 is filled with the cooled helium gas, with the result that the semiconductor wafer W disposed on the electrostatic chuck 8 is also cooled by the cool helium gas.

A heater 37 fixed to a heater substrate 39 and including a resistance heating body 38 is interposed between the susceptor 7 and the supporting member 3. The heater 37 and the coolant referred to previously collectively permit controlling the temperature more accurately. The heater 37 will be described more in detail herein later.

A focusing ring 18 made of an insulating material is arranged along the upper peripheral region of the susceptor 7 in a manner to surround the semiconductor wafer W. The reactive ions included in the plasma are caused to be effectively incident to the semiconductor wafer W by the focusing ring 18.

An upper electrode 21 is arranged in the upper portion of the processing chamber 1 in a manner to face the susceptor 7. The upper electrode 21 is electrically insulated from the processing chamber 1 by an insulating member 25. At least that portion 21a of the upper electrode 21 which faces the susceptor 7 is formed of, for example, amorphous carbon or silicon. The upper electrode 21 is hollow in the entire region and connected to the ground via a wire 22.

A large number of gas spurting holes 23 are formed in the portion 21a of the upper electrode 21. A treating gas supplied through a gas inlet port 24 formed in the upper portion of the upper electrode 21 is spurted through these gas spurting holes 23 toward the semiconductor wafer W.

An exhaust pipe 1a is connected to the bottom portion of the processing chamber 1 for exhausting the gas from within the processing chamber. To be more specific, a vacuum pump (not shown) connected to the exhaust pipe 1a is operated so as to exhaust the gas from within the processing chamber 1 and, thus, to maintain the inner pressure of the processing chamber 1 at, for example, 0.5 Torr.

A monitor terminal 41 for detecting the negative potential $V_{DC}$ is mounted on the upper surface of the susceptor 7. As shown in FIG. 2, the monitor terminal 41 is interposed between the electrostatic chuck 8 and the focusing ring 18.

FIG. 3 shows in detail the construction of the monitor terminal 41 for detecting the negative potential $V_{DC}$. As shown in FIG. 3, the monitor terminal 41 comprises an electrode body 42 formed of a conductive material having a high resistance to plasma, i.e., a material which is unlikely to be sputtered under a plasma atmosphere. For example, the electrode body 42 is formed of SiC or a refractory metal. The monitor terminal 41 also comprises an insulating member 43 formed of, for example, quartz. The electrode body 42 is inserted into a recess of the insulating member 43 such that the top portion of the electrode body 42 is positioned in the vicinity of the semiconductor wafer W electrostatically chucked by the electrostatic chuck 8. To be more specific, it is desirable for the top portion of the electrode body 42 to be positioned above the susceptor 7 and below the plasma sheath. Most desirably, the top surface of the electrode body 42 is flush with the treating surface (upper surface) of the semiconductor wafer W held on the electrostatic chuck 8. Where the electrode body 42 is arranged in this fashion, the negative potential $V_{DC}$ (bias potential) can be monitored more accurately, as described herein later.

A lead wire 44 is connected to the electrode body 42. As shown in FIG. 3, the lead wire 44, which is covered with an insulating film 45, extends through the susceptor 7, the susceptor supporting member 3 and the insulating plate 2 so as to be connected to a $V_{DC}$ monitor 46 positioned outside the processing chamber 1. The $V_{DC}$ level detected by the electrode body 42 is measured by the $V_{DC}$ monitor 46.

The $V_{DC}$ monitor 46 is connected to a controller 47 serving to control the output and frequency of the high frequency power supply 11. Based on the result of detection performed by the $V_{DC}$ monitor 46, the output and frequency of the high frequency power supply 11 are controlled by means of, for example, the feed back control.

In applying an etching processing to, for example, a semiconductor wafer W used as an object to be etched by using a plasma etching apparatus of the construction described above, a dummy wafer equal to the wafer W in shape and material is used first for performing the plasma adjustment in advance.

In the first step, a gate valve (not shown) provided to the side wall of the processing chamber 1 is opened, followed by introducing through the opened gate valve a dummy wafer into the processing chamber by a transfer apparatus (not shown). The dummy wafer introduced into the processing chamber is disposed on a predetermined position on the upper surface of the electrostatic chuck 8 to which a high DC voltage is applied from the DC power supply 17, with the result that the dummy wafer is electrostatically chucked and fixed to the electrostatic chuck 8.

A processing gas, e.g., a $CF_4$ gas, is introduced from a processing gas supply device into the processing chamber 1 through the gas inlet port 24 and the gas spurting ports 23 formed in the upper electrode 21. At the same time, the pressure within the processing chamber 1 is maintained at, for example, 0.5 Torr. Then, a high frequency power of, for example, 1 kW having a frequency of, for example, 13.56 MHz is applied from the high frequency power supply 11 to the susceptor 7, with the result that plasma is generated within the processing chamber 1 and, thus, the dummy wafer is subjected to etching. In this step, the negative potential $V_{DC}$ on the dummy wafer is detected by the monitor terminal 41 and monitored by the $V_{DC}$ monitor 46, making it possible to know the $V_{DC}$ level caused by the generated plasma on the real time basis.

The output and frequency of the high frequency power supply 11 are controlled by the controller 47 based on the output signal generated from the $V_{DC}$ monitor 46 so as to change the $V_{DC}$ level and, thus, to achieve a desired plasma state. It follows that, where the shifting amount of $V_{DC}$ is set at a predetermined value, the damage, which is to be done to the members within the processing chamber of the apparatus, can be prevented in advance by, for example, lowering the output of the high frequency power source 11.

After the plasma adjustment described above, the dummy wafer is replaced by a semiconductor wafer which is to be subjected to a plasma processing, thereby applying, for example, a plasma etching to the semiconductor wafer.

As described above, the $V_{DC}$ monitor terminal 41 is arranged in the vicinity of the semiconductor wafer W in the apparatus of the present invention, making it possible to detect the $V_{DC}$ level highly accurately, compared with the conventional monitoring method. Further, where the monitor terminal 41 is arranged such that the top surface of the electrode body 42 is flush with the treating surface of the dummy wafer, the $V_{DC}$ level monitored by the $V_{DC}$ monitor 46 can be regarded as substantially equal to the $V_{DC}$ level on the actual dummy wafer, making it possible to detect the $V_{DC}$ level more accurately.

It should also be noted that the electrode body 42 is formed of a conductive material which is unlikely to be sputtered by plasma such as SiC or a refractory metal. Naturally, wear of the electrode body 42 caused by the sputtering phenomenon need not be worried about even if the electrode body 42 is exposed to plasma.

Figure 4:
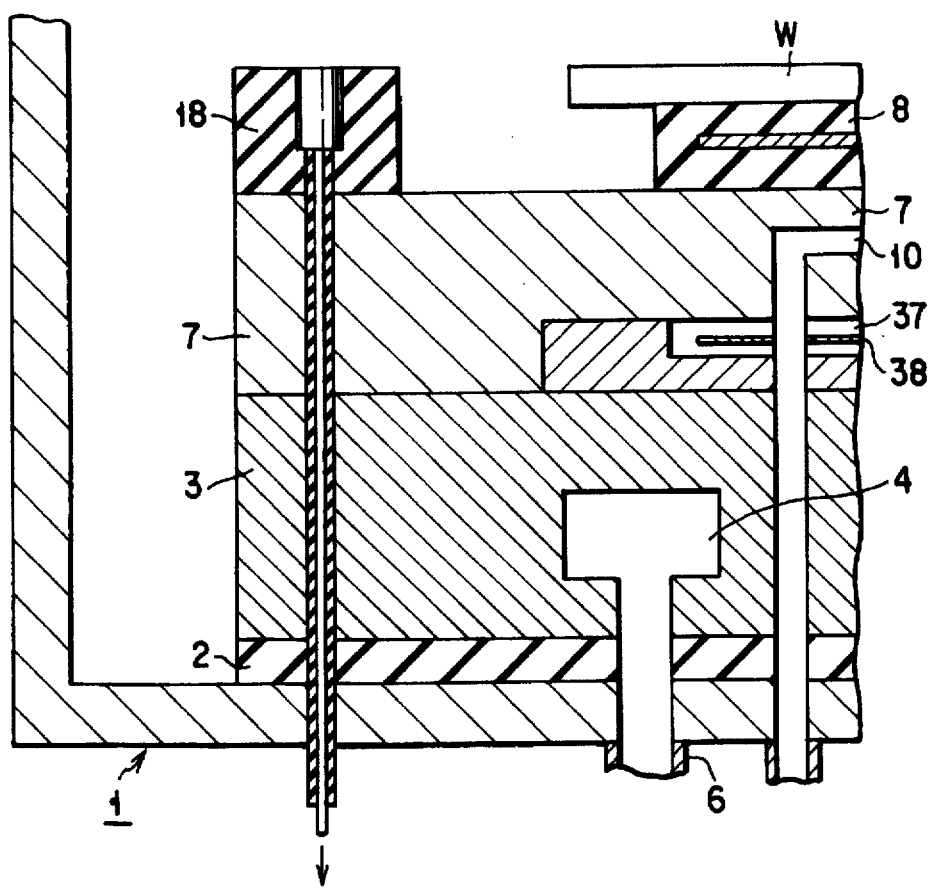
FIG. 4 is a cross sectional view showing a modification of the apparatus shown in FIG. 2.

In the embodiment described above, the $V_{DC}$ monitor terminal 41 is arranged on the susceptor 7 and positioned between the focusing ring 18 and the electrostatic chuck 8. However, it is not absolutely necessary to arrange the $V_{DC}$ monitor terminal in the particular position noted above. In other words, a reasonable effect can be obtained as far as the $V_{DC}$ monitor terminal is arranged in the vicinity of the semiconductor wafer W. It should also be noted that the electrode body 42 is inserted into the recess of the insulating member 43 interposed between the focusing ring 18 and the electrostatic chuck 8. Alternatively, it is also possible to insert the electrode body 42 into the focusing ring 18, as shown in FIG. 4.

Figure 5:
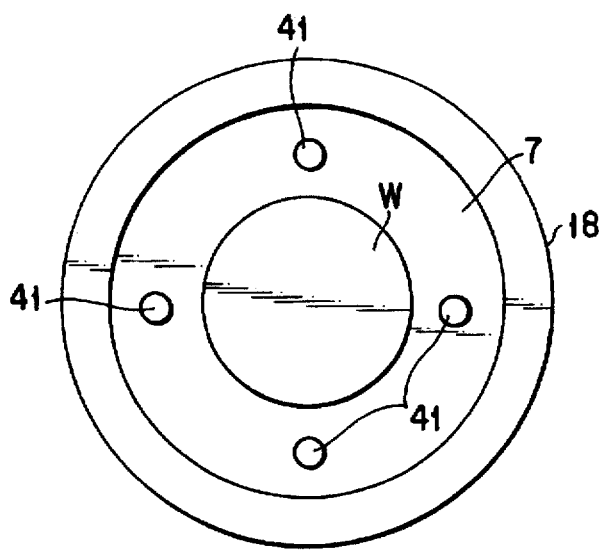
FIG. 5 is a plan view showing another modification of the apparatus shown in FIG. 2.

Further, only one monitor terminal 41 is used in the embodiment described above. However, it is also possible to arrange a plurality of monitor terminals in the vicinity of the semiconductor wafer W, as shown in FIG. 5. In this case, the actual state of plasma such as a plasma inclination can be grasped more accurately based on the $V_{DC}$ level detected by each monitor terminal. If the members of the monitor terminal such as the electrode body are adjusted on the basis of the actual state of plasma thus grasped, the plasma can be made more uniform. In this case, it is desirable to arrange the monitor terminals to surround the semiconductor wafer substantially equidistantly in the circumferential direction or substantially equidistantly in respect of the distance between the monitor terminal and the periphery of the semiconductor wafer. What should also be noted is that the $V_{DC}$ level detected by the $V_{DC}$ monitor 46 is substantially equal to the actual $V_{DC}$ level of the object to be processed, e.g., the wafer W, as described previously, making it possible to control the $V_{DC}$ level accurately to meet the actual situation.

In the embodiment described above, the monitor terminal 41 is constructed such that the electrode body 42 is inserted into and fixed to a recess made in the insulating member 43. Alternatively, the electrode body 42 itself can be mounted movable in the vertical direction or can be mounted detachably. In this case, the top surface of the electrode body can be made flush with the treating surface of the object to be treated without difficulty, making it possible to detect highly accurately the $V_{DC}$ level regardless of the height of the processing surface of the object to be treated.

Let us describe a plasma processing apparatus according to a second embodiment of the present invention with reference to FIG. 6. As apparent from FIG. 6, the apparatus according to the second embodiment is substantially equal in its basic construction to the plasma processing apparatus of the first embodiment shown in FIG. 2. In the second embodiment shown in FIG. 6, however, what is monitored is the current flowing through the electrostatic chuck, not the negative potential $V_{DC}$ as in the first embodiment.

To be more specific, a monitoring lead wire 51 is branched from the power supply lead wire 16 connected to the high DC power supply 17 in the second embodiment shown in FIG. 6. Further, a current monitor 52 is connected to the monitoring lead wire 51. The output signal generated from the current monitor 52 is kept supplied to an abnormality detecting device 53. The discharge occurrence to the electrostatic chuck 8 during the etching process is detected in the abnormality detecting device 53 on the basis of the signal supplied from the current monitor 52. To be more specific, where the etching process is being normally carried out, the abnormality detecting device 53 supplies a normal signal to a display device 54. However, where an abnormality has taken place that discharge to the electrostatic chuck 8 has taken place, the current value monitored by the current monitor 52 is greatly fluctuated. In other words, the monitored current value enables the abnormality detecting device 53 to indicate the discharge occurrence in the electrostatic chuck 8. The detected signal is supplied to the display device 54, with the result that a warning is displayed on the display device 54. Naturally, the worker is enabled to know the abnormality of the discharge occurrence on the electrostatic chuck 8 within the processing chamber 1, making it possible to detect the abnormal discharge more accurately than in the prior art.

A display device generally used in a plasma processing apparatus of this kind such as a plasma etching apparatus can be used as the display device 54.

Let us describe a plasma processing apparatus according to a third embodiment of the present invention with reference to FIG. 7 showing a cross section of the apparatus. The apparatus shown in FIG. 7 is equal in its basic construction to the plasma processing apparatus according to the second embodiment of the present invention shown in FIG. 6, except that both the negative potential $V_{DC}$ and the current flowing through the electrostatic chuck are monitored in the apparatus shown in FIG. 7. To be more specific, a monitoring lead wire 61 is branched from the power supply wire 14 of the high frequency power supply 11, and a $V_{DC}$ monitor 63 is connected via an RF filter 62 to the monitoring lead wire 61. As shown in FIG. 7, both the output signal generated from the $V_{DC}$ monitor 63 and the output signal generated from the current monitor 52 are kept supplied to the abnormality detecting device 53. The abnormal discharge occurrence during the etching process is detected within the detecting device 53 based on the signals supplied from both the current monitor 52 and the $V_{DC}$ monitor 63 as described in detail herein later. The result of the detection is displayed on the display device 54.

Where an etching process is being carried out normally as desired, a normal signal is supplied from the abnormality detecting device 53 to the display device 54. However, in the event of an abnormality during the etching treatment that a discharge takes place in the gas inlet pipe 10 through which flows a helium gas or in the pusher pin 32 extending within the hole 31, the $V_{DC}$ level monitored by the $V_{DC}$ monitor 63 is greatly changed. In this case, a monitored signal conforming with the change in the monitored $V_{DC}$ level is supplied to the abnormality detecting device 53. On the other hand, no change takes place in the DC current for operating the electrostatic chuck 8, said DC current being monitored by the current monitor 52. Of course, no change takes place in the monitored signal monitored by the current monitor 52, too.

As described above, a discharge occurrence in the helium gas supply system is detected by the abnormality detecting device 52 on the basis of each of the monitored signals, and the detection signal is supplied to the display device 54. As a result, a warning is displayed on the display device 54 to the effect that an abnormality has taken place in the helium gas supply system. It follows that the operator is enabled to know that an abnormality of discharge occurrence has taken place in the helium gas supply system within the processing chamber 1.

For example, where a discharge has taken place in the electrostatic chuck 8 during the etching process, a significant change takes place in each of the $V_{DC}$ level monitored by the $V_{DC}$ monitor 63 and the DC current monitored by the current monitor 53, said DC current serving to operate the electrostatic chuck 8. In this case, the abnormality detecting device 53 detects a discharge occurrence in the electrostatic chuck 8 on the basis of each of the monitored signals which have been significantly changed. Then, the detected signal is supplied from the abnormality detecting device 53 to the display device 54, with the result that a warning is displayed on the display device 54 to the effect that an abnormality has taken place in the electrostatic chuck 8. In this fashion, the operator is enabled to know the discharge occurrence in the electrostatic chuck 8.

The apparatus shown in FIG. 7 also permits detecting a deviation of the semiconductor wafer W disposed on the electrostatic chuck 8. Specifically, where the semiconductor wafer W is disposed on the location somewhat deviant from the predetermined location on the surface of the electrostatic chuck 8, a width of fluctuation in the monitored signal emitted from the current monitor 52 is relatively small even if a high DC current is supplied from the high DC power supply 17 to the electrostatic chuck 8. On the other hand, where a high frequency power for the plasma generation is applied under the deviated state of the semiconductor wafer W, the electrostatic chuck 8 is partly exposed directly to the plasma, leading to a significant change in the $V_{DC}$ level monitored by the $V_{DC}$ monitor 63. It follows that the abnormality detecting device 53 also permits detecting a deviation of the semiconductor wafer W, i.e., an object to be processed, based on each of the monitored signals. The detected signal is supplied from the abnormality detecting device 53 to the display device 54, with the result that a warning is displayed on the display device 53 to the effect that the semiconductor wafer W disposed on the electrostatic chuck is deviated from the desired location. Of course, the operator is enabled to know the abnormality relating to the location of the semiconductor wafer W.

In the embodiment described above, the abnormal discharge and the abnormal location of the semiconductor wafer W are detected on the basis of monitored signals from two systems quite differing from each other, i.e., the $V_{DC}$ level of the high frequency power system and the current level in the high DC current system for the electrostatic chuck. It follows that the result of the detection is highly reliable.

As described previously, the DC current supplied from the high DC power source 17 is monitored by the current monitor 52. On the other hand, the $V_{DC}$ level of the plasma based on the high frequency power source is monitored by the $V_{DC}$ monitor 63. What should also be noted is that the current monitor 52 and the $V_{DC}$ monitor 63 permit independently monitoring and controlling the systems noted above, making it possible to detect an abnormality inherent in each of these systems.

Further, the apparatus shown in FIG. 7 permits detecting the end point of an etching treatment.

As described above, the plasma processing apparatus according to the third embodiment of the present invention makes it possible to detect the occurrence and location of an abnormal discharge within the processing chamber 1. Further, it is possible to detect the deviation of the object to be processed such as a semiconductor wafer from a predetermined location on the surface of the electrostatic chuck.

Figure 8:
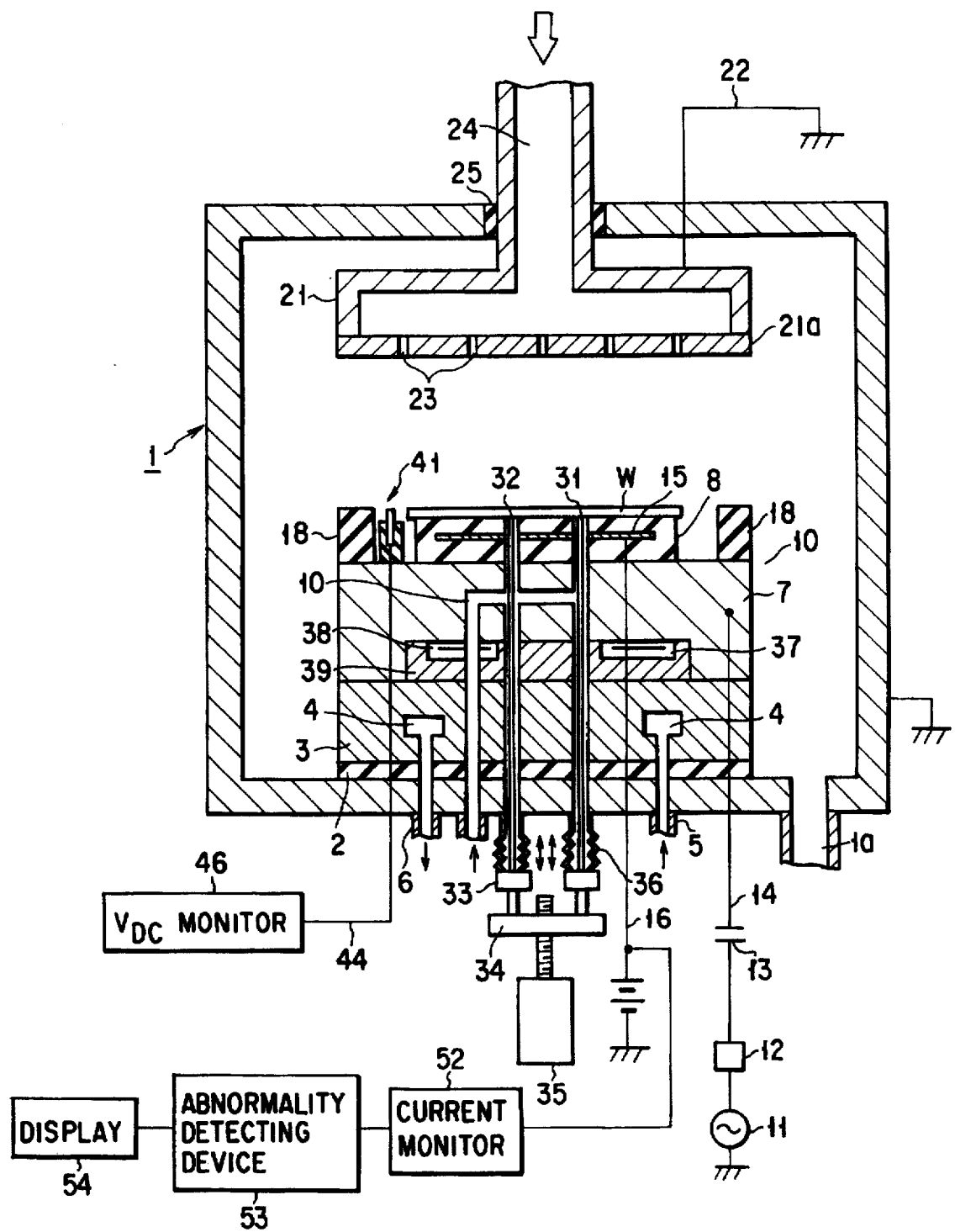
FIG. 8 is a cross sectional view showing a modification of the apparatus shown in FIG. 7.

FIG. 8 shows an additional modification in which the negative potential $V_{DC}$ is detected by a $V_{DC}$ monitor terminal 41 arranged in the vicinity of the object to be treated and monitored by a $V_{DC}$ monitor 46 as in the first embodiment. In this modification, the abnormal discharge and the deviation of the object from a desired location on the surface of the electrostatic chuck can be detected more accurately than in the apparatus shown in FIG. 7.

Let us describe a plasma processing apparatus according to a fourth embodiment of the present invention with reference to FIG. 9. The plasma processing apparatus of this embodiment permits detecting a deviation of an object to be processed such as a semiconductor wafer from a desired location on the surface of an electrostatic chuck so as to make it possible to prevent in advance the wafer from being broken and to prevent a failure to obtain a uniform plasma treatment.

Specifically, FIG. 9 is a cross sectional view showing a plasma processing apparatus according to the fourth embodiment of the present invention. As seen from the drawing, the apparatus is substantially equal in it basic construction to the apparatus according to any of the first to third embodiments described previously.

In the fourth embodiment, the electrostatic chuck 8 is connected to the DC high voltage power supply 17 via a switch 71. The high frequency power supply 11 is connected to the susceptor 7 via a switch 72. Further, a stabilizing resistor 73 is provided between the switch 71 and the DC high voltage power supply 17 in the lead wire 16. Still further, an ammeter 74 acting as a current detecting means is connected in parallel with the stabilizing resistor 73.

On the other hand, a plurality of gas supply holes 80, which vertically extend through the electrostatic chuck 8, are connected to the gas inlet passageway 10 extending through the susceptor supporting plate 3 and the susceptor 7. For example, a helium gas stored in a gas supply source (not shown) is supplied by a pump 81 so as to fill each of the gas inlet passageway 10 and the gas supply holes 80 with the helium gas. Naturally, the helium gas acts as a heat transfer medium so as to cool the semiconductor wafer W disposed on the electrostatic chuck 8 to a predetermined temperature, e.g., about −50° to −100° C.

The signal sent from the ammeter 74 is supplied through an A/D converter (not shown) to a controller 75 to enable the controller 75 to generate a control signal which is supplied to each of the switches 71, 72 and the pump 81.

The controller 75 comprises, for example, a micro computer which permits controlling the arithmetic calculation, and performs the function described below.

Specifically, FIG. 10 is an equivalent circuit diagram of a power supply circuit including the conductive layer 15 of the electrostatic chuck 8, the semiconductor wafer W mounted on the surface of the electrostatic chuck 8, and the lead wire 16 connected between the conductive layer 15 and the DC high voltage power supply 17. As apparent from FIG. 10, the conductive layer 15 and the semiconductor wafer W collectively form a capacitor. Where the semiconductor wafer W is normally chucked electrostatically on the electrostatic chuck 8, the electric charges are not migrated between the conductive layer 15 and the wafer W, with the result that current does not flow through the lead wire 16. On the other hand, current flows through the lead wire 16 in the case where an electric charge migration takes place between the conductive layer 15 and the wafer W. For example, current flow through the lead wire 16 in the case where plasma formed in the processing chamber 1 causes a short-circuiting between the conductive layer 15 of the electrostatic chuck 8 and the wall of the processing chamber 1. The short-circuiting between the conductive layer 15 and the wall of the processing chamber 1 takes place in the case where the semiconductor wafer W disposed on the electrostatic chuck 8 is deviated from a desired location on the surface of the electrostatic chuck 8 so as to partly expose the surface of the electrostatic chuck 8 to the outside. It follows that the deviation of the semiconductor wafer W can be detected by detecting the current value in the event of the deviation.

Current also flows through the lead wire 16 in the case where a potential difference is brought about between the conductive layer 15 and the semiconductor wafer W. Such a potential difference is brought about when the semiconductor wafer W is electrostatically chucked onto the electrostatic chuck 8, and when a RF power is supplied to the system. Such being the situation, the current value detected by the ammeter 74 after the power supply to the electrostatic chuck 8 to electrostatically hold the semiconductor wafer W is compared with a predetermined current value stored in advance in the controller 75. It is determined by the controller 75 that a deviation of the semiconductor wafer W has taken place in the case where the detected current value arrives at a level higher than a predetermined value 10 as shown in FIG. 11A or where a predetermined current value $I_1$ continues to be maintained for a predetermined period of time T as shown in FIG. 11B. In this case, the controller 75 generates a control signal which permits opening the switches 71 and 72. Also, the controller 75 supplies a stop signal to the pump 81 when or before the particular control signal is supplied to the switches 71 and 72. It follows that the switches 71 and 72 are opened so as to stop supply of the high frequency power from the high frequency power supply 11 and to stop application of the high voltage from the DC high voltage power supply 17. At the same time, supply of the helium gas acting as a heat transfer medium is also stopped.

As described above, a short-circuiting is caused by the plasma between the conductive layer 15 of the electrostatic chuck 8 and the semiconductor wafer W in the event of deviation of the wafer W from a desired location on the surface of the electrostatic chuck 8. In order to detect the short-circuiting, a predetermined current value is set in the controller 75. Concerning the predetermined current value set in the controller 75, it is reasonable to use the current value which is obtained when any of the plurality of gas supply holes 80 formed in the electrostatic chuck 8 is partly exposed to the outside. It is also possible to detect the short-circuiting by measuring the flowing time of the current through the lead wire 16. In this case, it is possible to use as a criterion the condition as to whether a current corresponding to a predetermined threshold value continues to flow for a predetermined period of time. In the latter case, it is necessary to set the current value in the controller 75 at a level lower than for the former case. Otherwise, a plasma damage takes place after the predetermined period of time noted above. Also, if the current value is set in the controller 75 in the particular fashion noted above, deviation of the semiconductor wafer W from a desired location on the surface of the electrostatic chuck can be detected before the plasma damage is increased.

In the embodiment shown in FIG. 9, the current values are compared after the semiconductor wafer W is chucked onto the electrostatic chuck 8. As described previously, current flows through the lead wire 16 in the cases where the semiconductor wafer W held on the electrostatic chuck 8 is deviated from a desired location and where a high DC voltage is supplied from the high voltage DC power supply 17 to the electrostatic chuck 8 to enable the electrostatic chuck 8 to electrostatically hold the semiconductor wafer W. The particular timing of comparing the current values is intended to avoid confusion with the case of supplying a high DC voltage to the electrostatic chuck 8. The particular timing is also intended to avoid confusion with the case of supplying a RF power for the plasma formation. Incidentally, the current value may be set in the controller 75 in a plurality of steps in accordance with the amounts of deviation of the semiconductor wafer W from a desired location.

As described previously, the current flowing through the lead wire 16 connected to the electrostatic chuck 8 is detected by the ammeter 74 used as a current detecting means in the embodiment shown in FIG. 9. Where the detected current value is found to be higher than a predetermined level, or where a current value higher than a predetermined level is found to continue for a predetermined period of time, the plasma treatment is stopped by the controller 75. The particular technique makes it possible to prevent in advance an uneven plasma treatment and, at the same time, to prevent the dielectric breakdown of the electrostatic chuck 8. What should also be noted is that the supply of the heat transferring gas is stopped simultaneously with or before the stopping of the high frequency power supply from the high frequency power supply 11 and the stopping of the high DC voltage supply from the DC high voltage power supply 17. As a result, the semiconductor wafer W is prevented from being blown away by the back pressure of the heat transferring gas and from being broken away.

Let us describe in detail the heater 37 included in the plasma processing apparatus according to each of the embodiments described above.

As shown in FIG. 12, the heater 37, which comprises a heat generator 38 and an insulator 38a covering the heat generator 38, is in the shape of a disc having a thickness of several millimeters. The heat generator 38 is formed of, for example, tungsten, carbon or an Fe—Cr—Al alloy. On the other hand, the insulator 38a, which is intended to electrically insulate the heat generator 38 from a substrate 39, is generally formed of a ceramic material. Particularly, it is desirable to use aluminum nitride (AlN) for forming the insulator 38a. It should be noted that AlN exhibits a heat conductivity about 10 times as high as that of the ceramic material used in the past, e.g., $Al_2O_3$. In addition, AlN is excellent in its resistance to thermal shock and, thus, is unlikely to be broken even when exposed to a rapid change in temperatures. For example, $Al_2O_3$ exhibits such a high thermal expansion coefficient as $7.3 \times 10^{-6}/°$ C. in contrast to only $5 \times 10^{-6}/°$ C. for AlN. Also, the tensile strength of $Al_2O_3$ is as low as only 24 to 26 kgf/mm² in contrast to 40 to 50 kgf/mm² for AlN. What should also be noted is that AlN is an electric insulator and, thus, heat is transmitted via phonons. Further, AlN exhibits the peak value of heat conductivity at a temperature markedly lower than room temperature, as shown in FIG. 13. It follows that the heat conductivity of the insulator 38a formed of AlN is greater at the cryogenic temperature at which the susceptor 7 is maintained during the plasma treatment than at room temperature. What should also be noted is that the heat conductivity is increased in the low temperature region, as apparent from FIG. 13. In addition, the heat capacity (specific heat) of AlN is lowered with decrease in temperature. Because of the synergetic effect produced by these properties, AlN exhibits highly excellent characteristics when used as an electric insulator included in a heater. Further, AlN exhibits satisfactory properties as a heat soaking plate.

Figure 14:
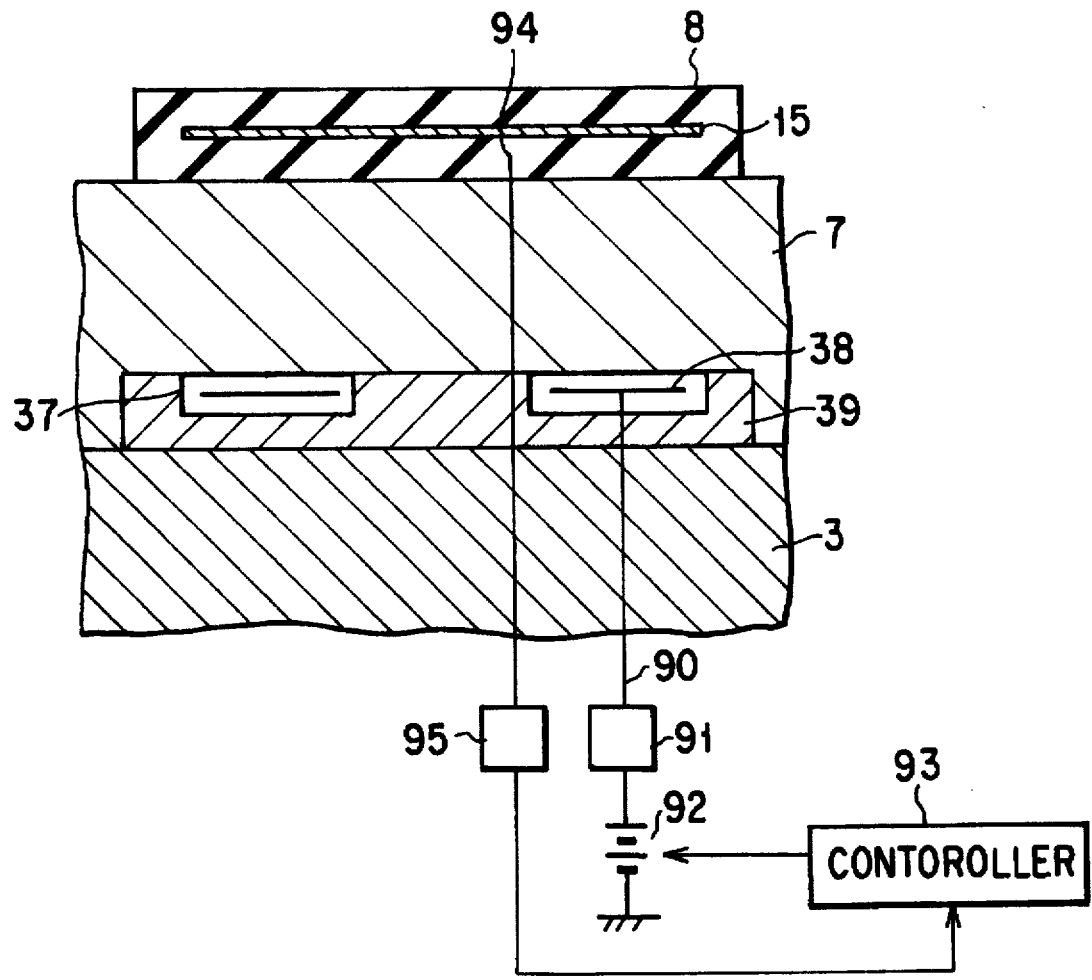
FIG. 14 is a cross sectional view showing the control system of the heater used in the plasma processing apparatus according to each of the embodiments of the present invention.

FIG. 14 shows the control system of the heater 37. As shown in FIG. 14, a power supplying lead wire 90 is connected to the heater 37, and the lead wire 90 is connected to a power supply 92 via a filter 91. Naturally, a predetermined power is supplied from the power supply 92 to the heater 37. On the other hand, the electrostatic chuck 8 is provided with a temperature detector 94 such as a thermocouple. The signal generated from the temperature detector 94 is supplied to a controller 93 via a filter 95 serving to remove the high frequency noise from the signal before supply to the controller 93. A predetermined temperature is set in advance in the controller 93, and a control signal, which is supplied to the power supply 92, is generated from the controller 93 on the basis of the predetermined temperature set therein. As a result, the amount of the heat generation from the heater 37 is controlled. Incidentally, the temperature detector 94 is not necessarily restricted to a thermocouple. It is also possible to use a thermometer utilizing the phenomenon that the reciprocating time of light is changed depending on temperatures, e.g., "Fluoroptic Thermometry" (trade name). In this case, it is unnecessary to use the filter 95.

In each of the embodiments described above, the technical idea of the present invention is applied to a plasma etching apparatus. Needless to say, however, it is also possible to apply the technical idea of the present invention to other plasma processing apparatuses such as an ashing apparatus and a CVD apparatus. Further, the object to be processed need not be restricted to semiconductor wafers. Other objects such as an LCD substrate can also be treated by the plasma processing apparatus of the present invention.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A plasma processing apparatus, comprising:

a first electrode on which an object to be processed is to be disposed;

a second electrode arranged to face said first electrode;

a high frequency power supply to supply a high frequency power to said first electrode;

means for supplying a processing gas for forming a plasma into a region between the first and second electrodes;

bias potential detecting means for detecting the bias potential of the first electrode, said bias detecting means having a detecting terminal positioned in a plasma-processing space formed by supply of a high frequency power to said first electrode;

electrostatic chucking means mounted on said first electrode for electrostatically chucking said object to be treated;

a DC power supply for applying a voltage to said electrostatic chucking means; and current detecting means having one terminal connected to the electrostatic chucking means for detecting the current flowing between said electrostatic checking means and said DC power supply.

2. The apparatus according to claim 1, wherein the upper end of said detecting terminal is positioned above said first electrode and below a plasma sheath generated within the region between the first and second electrodes.

3. The apparatus according to claim 2, wherein the upper end of said detecting terminal is flush with the surface of the object to be treated.

4. The apparatus according to claim 1, wherein a focusing ring is formed on the first electrode in a manner to surround said object to be processed, and said detecting terminal is provided to said focusing ring.

5. The apparatus according to claim 1, wherein said focusing ring is formed of SiC or a refractory metal.

6. The apparatus according to claim 1, wherein said detecting means is provided with a plurality of detecting terminals.

7. The apparatus according to claim 6, wherein said plurality of detecting terminals are arranged to surround said object to be processed.

8. The apparatus according to claim 7, wherein said plurality of detecting terminals are arranged equidistantly in the circumferential direction.

9. The apparatus according to claim 7, wherein said plurality of detecting terminals are arranged equidistantly in respect of the distance between each of the detecting terminals and the periphery of the object to be processed.

10. The plasma processing apparatus according to claim 1, which further comprises control means serving to control said high frequency power supply based on the bias potential detected by said detecting means.

11. The plasma processing apparatus according to claim 1, which further comprises temperature control means serving to control the temperature of the object to be treated, said temperature control means comprising a coolant passageway formed in said first electrode and a heater.

12. The plasma processing apparatus according to claim 11, wherein said heater comprises a heat generating body and an AlN insulator covering said heat generating body.

13. A plasma processing apparatus, comprising:
a first electrode on which an object to be treated is to be disposed;
a second electrode arranged to face said first electrode;
a high frequency power supply to supply a high frequency power to said first electrode;
electrostatic chucking means mounted on said first electrode for electrostatically chucking said object to be treated;
a DC power supply for applying a voltage to said electrostatic chucking means; and
current detecting means having one terminal connected to the electrostatic chucking means for detecting the current flowing between said electrostatic chucking means and said DC power supply.

14. The apparatus according to claim 13, wherein said electrostatic chucking means comprises an electrode body and an insulating member covering said electrode body.

15. The apparatus according to claim 13, which further comprises an abnormality detecting means serving to detect an abnormality of plasma based on the current value detected by said current detecting means.

16. The apparatus according to claim 13, which further comprises a high frequency power supply switch for turning ON/OFF the high frequency power supplied from said high frequency power supply and control means for turning said switch OFF when the detected value of said current detecting means arrives at a level or when the detected value continues to be on a level for a period of time.

17. The apparatus according to claim 16, which further comprises a DC power supply switch serving to turning ON/OFF the DC voltage supply from said DC power supply to said electrostatic chucking means, and control means for turning OFF said DC power supply switch when the detected value of the current detecting means arrives at a level or when the detected value continues to be on a level for a period of time.

18. The apparatus according to claim 16, which further comprises gas supply means for supplying a heat transferring gas into a region between said electrostatic chucking means and said object to be processed, and control means serving to stop supplying a gas from said gas supply means when the detected value of said current detecting means arrives at a value or when the detected value continues to be on a level for a period of time.

19. The apparatus according to claim 13, which further comprises temperature control means for controlling the temperature of said object to be processed, said temperature control means comprising a coolant passageway formed in said first electrode and heater.

20. The apparatus according to claim 19, wherein said heater comprises a heat generator and an AlN insulator covering said heat generator.

21. A plasma processing apparatus, comprising:
a first electrode on which an object to be processed is to be disposed;
a second electrode arranged to face said first electrode;
a high frequency power supply to supply a high frequency power to said first electrode;
means for supplying a processing gas for forming a plasma into a region between the first and second electrodes;
bias potential detecting means for detecting the bias potential of the first electrode;
electrostatic chucking means mounted on said first electrode for electrostatically chucking said object to be treated;
a DC power supply for applying a voltage to said electrostatic chucking means; and
current detecting means having one terminal connected to the electrostatic chucking means for detecting the current flowing between said electrostatic chucking means and said DC power supply.

22. The apparatus according to claim 21, which further comprises detecting means for detecting an abnormality of plasma based on the detected values of said bias potential detecting means and said current detecting means.

23. The apparatus according to claim 21, wherein said high frequency power supply is connected to said first electrode, and said bias detecting means serves to measure the potential of a power supply wire extending between said high frequency power supply and said first electrode.

24. The apparatus according to claim 21, wherein said bias potential detecting means comprises a detecting terminal arranged in a plasma-processing space formed by supply of a high frequency power to said first electrode.

25. The apparatus according to claim 21, which further comprises temperature control means for controlling the temperature of said object to be processed, said temperature control means comprising a coolant passageway formed in said first electrode and heater.

26. The apparatus according to claim 25, wherein said heater comprises a heat generating body and an AlN insulator covering said heat generating body.

27. A plasma processing apparatus, comprising:

a first electrode on which an object to be processed is to be disposed;

a second electrode arranged to face said first electrode;

a high frequency power supply to supply a high frequency power to either said first or second electrodes;

means for supplying a processing gas for forming a plasma into a region between the first and second electrodes; and bias potential detecting means for detecting the bias potential of the first electrode, said bias detecting means having a detecting terminal positioned in a plasma processing space formed by supply of the high frequency lower to either of said first or second electrodes;

wherein the upper end of said detecting terminal is positioned above said first electrode and below a plasma sheath generated within the region between the first and second electrodes, and wherein the upper end of said detecting terminal is flush with the surface of the object to be treated.

28. The apparatus according to claim 27, wherein a focusing ring is formed on the first electrode in a manner to surround said object to be processed, and said detecting terminal is provided to said focusing ring.

29. The apparatus according to claim 27, wherein said focusing ring is formed of SiC or a refractory metal.

30. The apparatus according to claim 27, wherein said detecting means is provided with a plurality of detecting terminals.

31. The apparatus according to claim 30, wherein said plurality of detecting terminals are arranged to surround said object to be processed.

32. The apparatus according to claim 31, wherein said plurality of detecting terminals are arranged equidistantly in the circumferential direction.

33. The apparatus according to claim 31, wherein said plurality of detecting terminals are arranged equidistantly in respect of the distance between each of the detecting terminals and the periphery of the object to be processed.

34. The plasma processing apparatus according to claim 27, which further comprises control means serving to control said high frequency power supply based on the bias potential detected by said detecting means.

35. The plasma processing apparatus according to claim 27, which further comprises temperature control means serving to control the temperature of the object to be treated, said temperature control means comprising a coolant passageway formed in said first electrode and a heater.

36. The plasma processing apparatus according to claim 35, wherein said heater comprises a heat generating body and an AlN insulator covering said heat generating body.

* * * * *